(12) United States Patent
Imai et al.

(10) Patent No.: US 6,214,740 B1
(45) Date of Patent: Apr. 10, 2001

(54) SEMICONDUCTOR MANUFACTURING APPARATUS

(75) Inventors: Shinichi Imai, Osaka; Hideo Nikoh, Shiga; Nobuhiro Jiwari, Osaka, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/051,815

(22) PCT Filed: Jan. 23, 1997

(86) PCT No.: PCT/JP97/00151

§ 371 Date: Apr. 16, 1998

§ 102(e) Date: Apr. 16, 1998

(87) PCT Pub. No.: WO97/27622

PCT Pub. Date: Jul. 31, 1997

(30) Foreign Application Priority Data

Jan. 26, 1996 (JP) .................................................. 08-11434

(51) Int. Cl.⁷ .................................................. H01L 21/461
(52) U.S. Cl. ............................................. 438/710; 156/345
(58) Field of Search .................... 156/345; 216/67; 438/710

(56) References Cited

U.S. PATENT DOCUMENTS 5,362,361 * 11/1994 Tatsumi ................................ 156/662
5,474,649 * 12/1995 Kava ..................................... 156/345
5,556,500 * 9/1996 Hasegawa ............................. 156/345
5,556,501 * 9/1996 Collins ................................. 156/345
6,007,673 * 12/1999 Kugo et al. ........................... 156/345

FOREIGN PATENT DOCUMENTS

| 0 601 468 | 6/1994 | (EP) . |
| 0 651 434 | 5/1995 | (EP) . |
| 57-76840 | 5/1982 | (JP) . |
| 61-276322 | 12/1986 | (JP) . |
| 62-47130 | 2/1987 | (JP) . |
| 3-138381 | 6/1991 | (JP) . |

OTHER PUBLICATIONS

Wolf, Stanley and Richard Tauber. Silicon Processing. vol. 1, Ch. 16 p. 581–582, 1986.*

* cited by examiner

*Primary Examiner*—Richard Bueker
*Assistant Examiner*—Erin Fieler
(74) *Attorney, Agent, or Firm*—Merchant & Gould P.C

(57) ABSTRACT

A manufacturing apparatus for semiconductor devices comprises as a halogen scavenger a silicon ring (12) having an average surface roughness of 1–1000 μm, arranged around a silicon substrate (6) on a lower electrode (3) in a reaction chamber (7); and an upper silicon element (5) as another halogen scavenger, having an average surface roughness of 1–1000 μm, arranged above the silicon substrate (6). In this apparatus, $C_2F_6$ is used as a gas to be introduced into the chamber (7) and fluorine can be effectively scavenged in the initial phase of operation, so that semiconductor devices can be aged faster than in conventional apparatus.

7 Claims, 4 Drawing Sheets

SEMICONDUCTOR MANUFACTURING APPARATUS

FIELD OF THE INVENTION

The present invention relates to a dry-etching apparatus for semiconductor devices.

BACKGROUND OF THE INVENTION

In recent years, the integration degree of semiconductor devices has risen remarkably. The increase of the integration degree is sustained by advances in process techniques. Especially, advances in photolithography techniques and dry etching techniques play a great role for the rise of the integration degree. In recent dry-etching techniques, a tendency can be observed toward the active use, from the view point of miniaturization, of a low gas pressure, high density plasma. Considering such a background, dry-etching apparatus using an electron cyclotron resonance plasma, an inductive coupling type plasma or a helicon wave excitation plasma have been developed and sold (see for example: "Semiconductor World" Oct. issue 1993, pp. 68–75).

Below, an example for a conventional oxide film etching apparatus is explained with reference to FIG. 1, which shows an apparatus using an inductive coupling type plasma.

In FIG. 1, numeral 1 is an induction coil and numeral 2 is a high frequency power source, which supplies the induction coil 1 with high frequency electricity. Numeral 3 is a lower electrode and numeral 4 is a high frequency power source, which supplies the lower electrode 3 with high frequency voltage. Numeral 5 is an upper silicon electrode and numeral 6 is a silicon substrate placed on the lower electrode 3 and arranged in parallel to the upper silicon electrode 5 within at reaction chamber 7. Numeral 8 is a pressure control valve and numeral 9 is an exhaust pump, by which a predetermined pressure is maintained in the reaction chamber 7. Numeral 10 is a gas bottle, supplying $C_2F_6$ to the reaction chamber 7 through a mass flow 13. Numeral 11 is a heater, which maintains the upper silicon electrode 5 at a constant temperature. Numeral 12 is a silicon ring, which is arranged to enclose the silicon substrate 6 on the lower electrode 3. Numeral 13 is a mass flow and numeral 14 is a matcher to attain impedance matching between the high frequency power source 4 and the lower electrode 3.

$C_2F_6$ is introduced into the reaction chamber 7 from the gas bottle 10 and maintained at a predetermined pressure. A plasma is generated in the reaction chamber 7 by supplying the induction coil 1 with high frequency electric power from the high frequency power source 2. Ions from the plasma are attracted by impressing a bias voltage onto the lower electrode 3 with the high frequency power source 4, so that the silicon substrate 6 is etched.

The silicon ring 12 and the upper silicon electrode 5 (which are referred to as silicon members below) realize a high etching speed ratio of the oxide film against the silicon substrate 6 by decreasing the fluorine in the plasma due to a reaction with silicon (see FIG. 2 B). This silicon member has a smooth surface, and as is shown in FIG. 3B, the average roughness of the irregularities H of the surface is about 0.1 µm.

Numeral 15 of FIG. 4 is an example for the relationship between operating time T and selectivity ratio R for the etch rate of the oxide film of the silicon substrate with respect to the resist, when conventional silicon members with a smooth surface are used.

A constant time period is necessary so that the silicon members can scavenge halogen elements. After such aging is finished, a stable etch rate is attained.

However, as can be gathered from numeral 15 of FIG. 4, in a conventional manufacturing apparatus using silicon members with a smooth surface, a long period of time is necessary to stabilize the selectivity ratio R for the etch rate of the oxide film with respect to the resist. That means, there was the problem that a long aging time is necessary to put the silicon members into a condition where they can scavenge halogen elements.

SUMMARY OF THE INVENTION

In order to solve the problems of the prior art, it is a purpose of the present invention to provide a manufacturing apparatus for semiconductor devices, which can abbreviate the aging time by having a halogen scavenger with irregularities on its surface.

In order to attain this purpose, a manufacturing apparatus for semiconductor devices according to the present invention comprises a halogen scavenger having tiny irregularities on its surface in a reaction chamber of a dry-etching apparatus and the average roughness of those tiny irregularities is 1–1000 µm.

Because such a manufacturing apparatus for semiconductor devices comprises a halogen scavenger having irregularities on its surface, the effective surface area for halogen elements is maintained from an initial condition, so that the aging time is abbreviated.

When the average roughness of those tiny irregularities in the manufacturing apparatus for semiconductor devices is 1–1000 µm, the aging time can be abbreviated and an unfavorable influence such as an etching stop can be prevented.

It is preferable that the average roughness of the tiny irregularities in the manufacturing apparatus for semiconductor devices is 1–10 µm.

It is preferable that the halogen scavenger in the manufacturing apparatus for semiconductor devices comprises at least one material selected from the group consisting of silicon and carbon.

It is preferable that the halogen scavenger in the manufacturing apparatus for semiconductor devices is a silicon ring arranged around the silicon substrate to be etched.

It is preferable that the halogen scavenger in the manufacturing apparatus for semiconductor devices is an upper silicon electrode arranged above the silicon substrate to be etched.

It is preferable that the irregularities in the manufacturing apparatus for semiconductor devices are produced by wet-etching.

It is preferable that a gas used for dry-etching in the manufacturing apparatus for semiconductor devices is $C_2F_6$.

DESCRIPTION OF THE PREFERRED EMBODIMENTS

The aspect in which the manufacturing apparatus for semiconductor devices differs the most from said conventional apparatus is that as halogen scavengers, that means the silicon ring 12 and the upper silicon electrode 5, members with a rough surface having irregularities are used.

Figure 1:
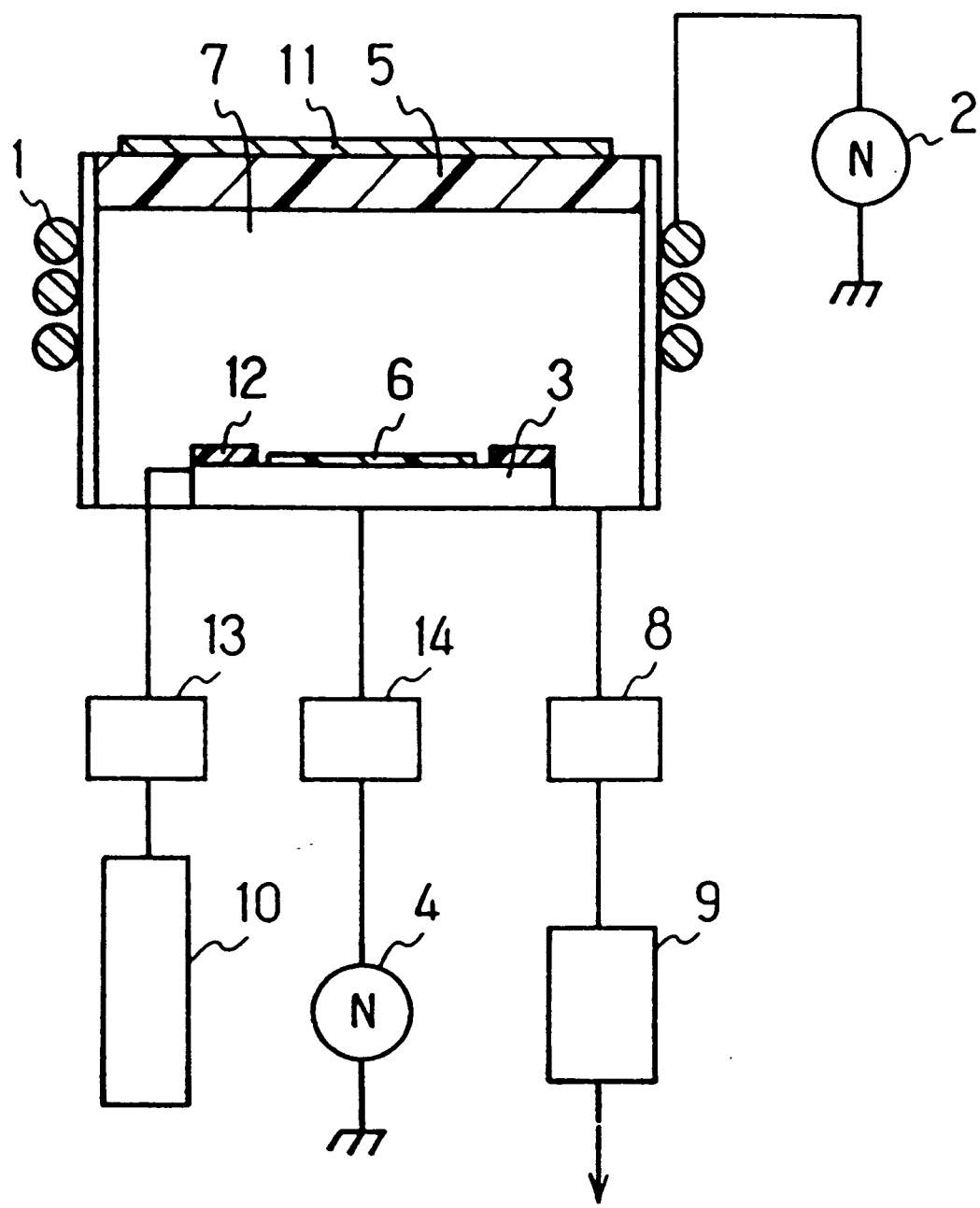
FIG. 1 is a diagram of an etching apparatus for semiconductor devices according to an example of the present invention.
Figure 3A:
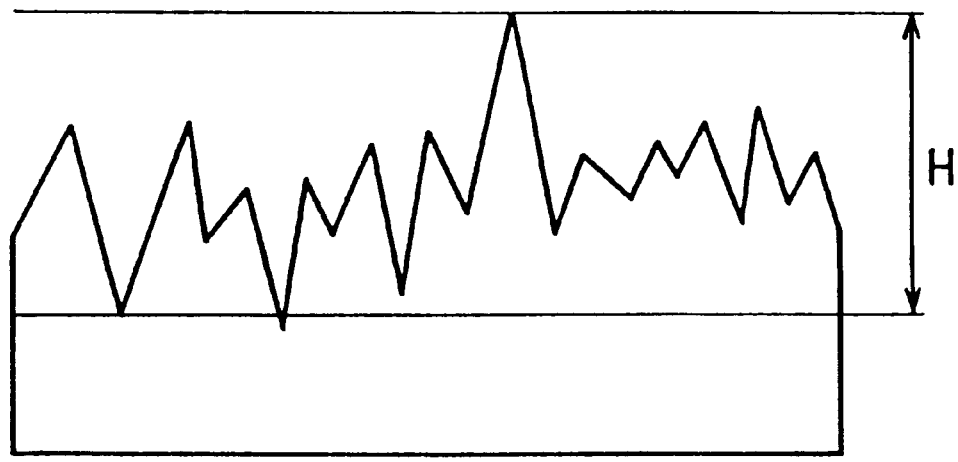
FIG. 3A is an enlarged view of the surface of a halogen scavenger in an example of an apparatus according to the present invention.
Figure 3B:
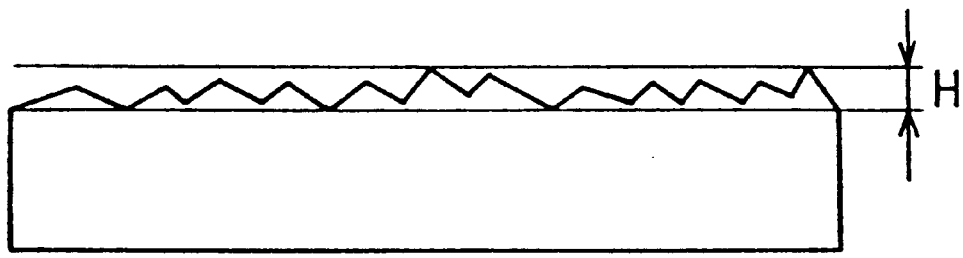
FIG. 3B is an enlarged view of the surface of a halogen scavenger in an example of a conventional apparatus.

An example of the present invention is explained below with reference to the drawings. The basic structure of this example of an apparatus is shown in FIG. 1. Because the structure is similar to conventional examples, a detailed explanation has been omitted. $C_2F_6$ was used as a gas to be introduced into reaction chamber 7. The pressure of the gas was set to $5 \times 10^3$ Torr. The average roughness of the surface irregularities H of the silicon ring 12 and the upper silicon electrode 5 was made to be at least 1 $\mu$m and at least 10 times the surface roughness of conventional halogen scavengers, as can be seen in FIG. 3A. Under the surface condition (surface morphology) in FIG. 3A, the crystal grain boundaries emerge, an aspect that is different from the surface condition in FIG. 3B.

Figure 2A:
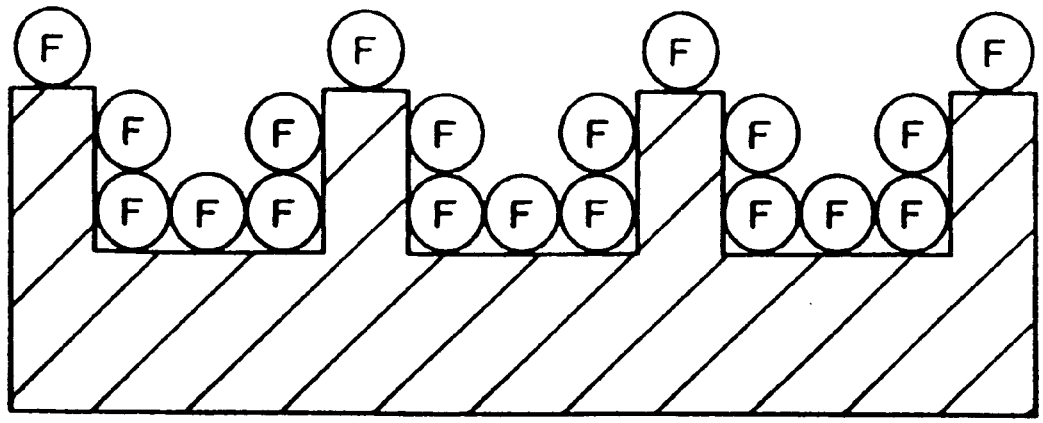
FIG. 2A is a model diagram showing the principle underlying an apparatus according to the present invention.
Figure 2B:
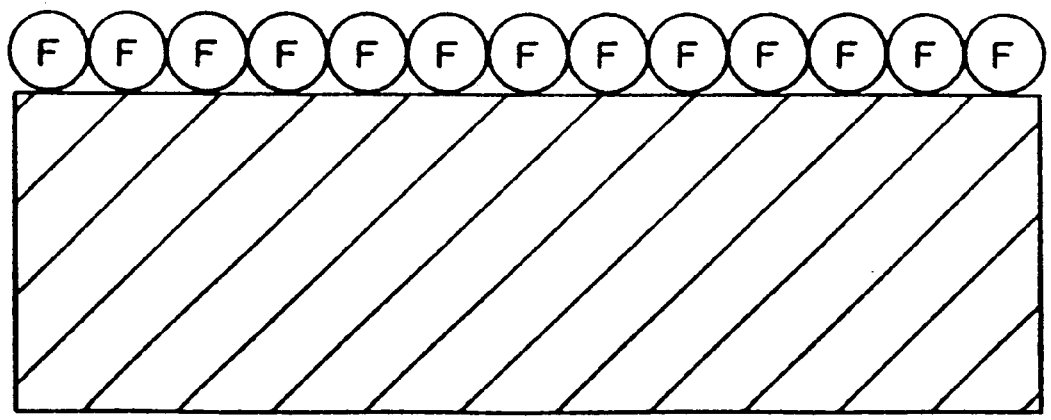
FIG. 2B is a model diagram showing the principle underlying a conventional apparatus.

By making the surface of the halogen scavengers, namely the silicon ring 12 and the upper silicon electrode 5, a rough surface, fluorine can be scavenged from the initial operating condition of the manufacturing apparatus. This mechanism is schematically shown in FIG. 2A. FIG. 2B shows the scavenging mechanism for a conventional member.

As becomes clear from the models shown in FIGS. 2A and 2B, when the halogen scavenger has a big effective surface area, more fluorine can be scavenged. However, an effective surface area that is too big has an unfavorable influence on performance characteristics and may cause the etching to stop because too much fluorine is scavenged, so it is preferable that the surface roughness is not more than 1000 $\mu$m.

Consequently, the average roughness of the irregularities of the halogen scavengers is preferably in a range of 1–1000 $\mu$m, more preferable is a range of 1–10 $\mu$m.

The rough surface of such a halogen scavenger can be produced by wet-etching. In this example, a solvent of hydrogen fluoride (HF) and nitric acid ($HNO_3$) mixed in a ratio of 1:10 was used to perform wet-etching at 25° C. fluid temperature for 30 min.

Figure 4:
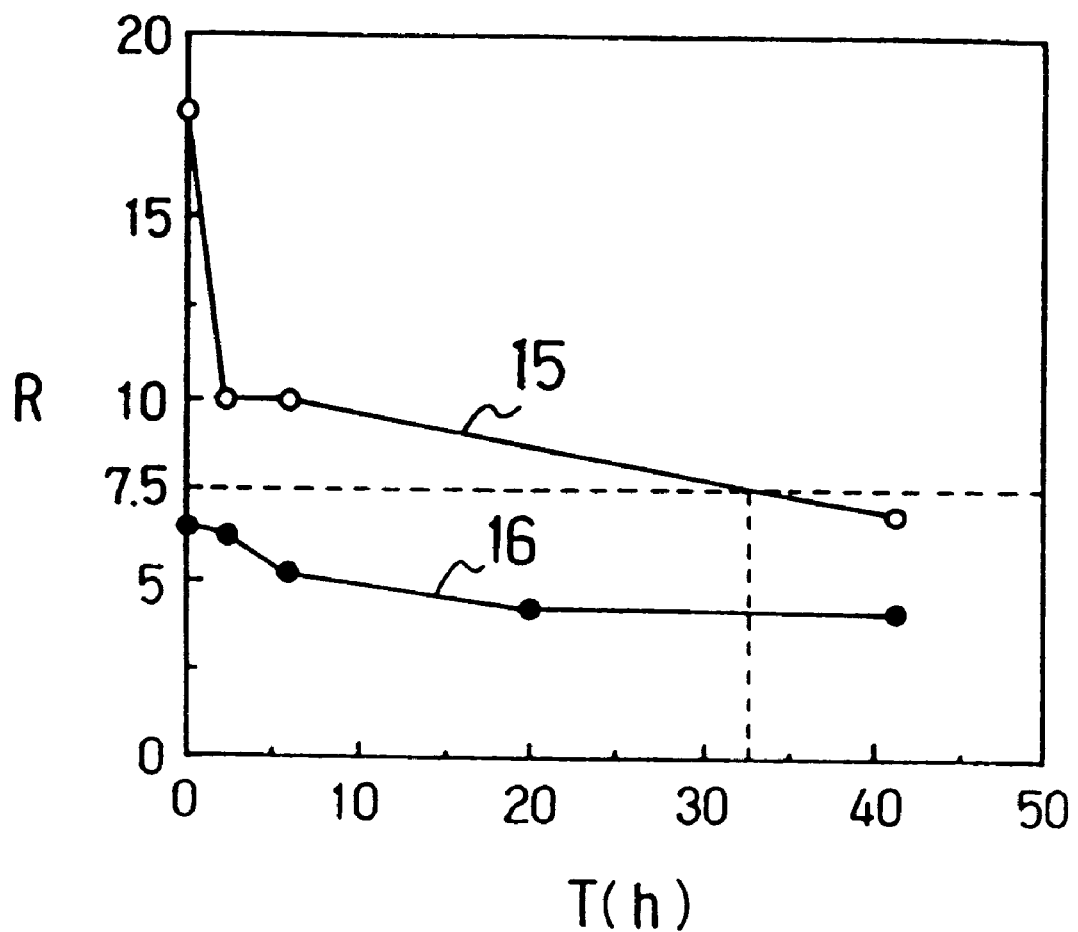
FIG. 4 shows the relationship between operating time T of an apparatus according to the present invention and selectivity ratio R of the oxide film etch rate of the silicon substrate against the resist, compared to the situation in a conventional apparatus.

FIG. 4 shows the relationship between the operating time T of an apparatus according to the present invention, which uses a halogen scavenger with large surface roughness and the selectivity ratio R of the oxide film etch rate of the silicon substrate against the resist, compared to the situation in a conventional apparatus. Numeral 15 indicates the measured results for a conventional example and numeral 16 the results for an example according to the present invention.

In the example of the present invention, a halogen scavenger with 3 $\mu$m average roughness of the irregularities was used. In the example of a conventional apparatus, a halogen scavenger with 0.2 $\mu$m average roughness of the irregularities was used. In both the example of the present invention and the conventional apparatus, a silicon ring with 210.4 mm internal diameter, 272.9 mm external diameter and 12.9 mm thickness was used.

As becomes clear from FIG.4, in the example of the present invention as indicated by numeral 16, the time to reach a stable selectivity ratio R of the oxide film etch rate of the silicon substrate against the resist is shorter than in a conventional apparatus as indicated by numeral 15. For example, if a standard value for the selectivity ratio R of the oxide film etch rate against the resist is assumed to be 7.5, the conventional example as indicated by numeral 15 needs 32.5 hours aging time to reach the standard value 7.5, whereas the present example as indicated by numeral 16 needs no aging time at all.

Silicon was used for the halogen scavenger in the present example, but of course the same effect can also be attained by using carbon instead.

As has been explained above, the aging time can be abbreviated by using a manufacturing apparatus for semiconductor devices according to the present invention, which comprises a halogen scavenger with irregularities on its surface.

INDUSTRIAL APPLICABILITY

The manufacturing apparatus for semiconductor devices according to the present invention can be used as a dry-etching apparatus of silicon substrates for semiconductor devices, because the aging time for dry-etching can be abbreviated.

What is claimed is:

1. A dry-etching method, comprising:
   placing a halogen scavenger in a reaction chamber of a dry-etching apparatus using a plasma, the halogen scavenger having a surface on which tiny irregularities with an average roughness in a range between 1–1000 $\mu$m are formed and being able to scavenge fluorine contained in the plasma;
   placing a substrate in the reaction chamber, the substrate having an oxide film and a resist film formed thereon; and
   carrying out dry-etching of the oxide film formed on the substrate using a gas containing C and F,
   wherein the dry-etching is started directly after initial placement of the substrate in the reaction chamber after placing the halogen scavenger in the reaction chamber and is carried out under a condition in which a selectivity ratio of the oxide film etch rate against the resist film is below a standard value for carrying out the dry-etching stably.

2. The dry-etching method according to claim 1, wherein the average roughness of the tiny irregularities is 1–10 $\mu$m.

3. The dry-etching method according to claim 1, wherein the tiny irregularities are produced by wet-etching.

4. The dry-etching method according to claim 1, wherein the halogen scavenger comprises at least one material selected from the group consisting of silicon and carbon.

5. The dry-etching method according to claim 1, wherein the halogen scavenger is a silicon ring arranged around a silicon substrate to be etched.

6. The dry-etching method according to claim 1, wherein the halogen scavenger is an upper silicon electrode arranged above a silicon substrate to be etched.

7. The dry-etching method according to claim 1, wherein a gas used for the dry-etching is $C_2F_6$.

* * * * *